United States Patent
Higuchi

(10) Patent No.: US 10,746,770 B2
(45) Date of Patent: Aug. 18, 2020

(54) CAPACITIVE SENSOR SUPPRESSING BREAKAGE OF ELECTRODE LINKING PARTS DUE TO ELECTROSTATIC DISCHARGE

(71) Applicant: Alps Alpine Co., Ltd., Ota-ku, Tokyo (JP)

(72) Inventor: Shinichi Higuchi, Niigata-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 0 days.

(21) Appl. No.: 16/154,554

(22) Filed: Oct. 8, 2018

(65) Prior Publication Data
US 2019/0041441 A1 Feb. 7, 2019

Related U.S. Application Data

(63) Continuation of application No. PCT/JP2017/007883, filed on Feb. 28, 2017.

(30) Foreign Application Priority Data

Apr. 19, 2016 (JP) .................................. 2016-083900

(51) Int. Cl.
*G01R 27/26* (2006.01)
*G06F 3/044* (2006.01)

(52) U.S. Cl.
CPC ......... *G01R 27/2605* (2013.01); *G06F 3/044* (2013.01); *G06F 3/0443* (2019.05); *G06F 3/0446* (2019.05); *G06F 2203/04111* (2013.01)

(58) Field of Classification Search
CPC ...... G06F 3/041; G06F 3/0412; G06F 3/0416; G06F 3/044; G06F 3/0445; G06F 3/0446; G06F 3/047; G06F 2203/04111

(Continued)

(56) References Cited

U.S. PATENT DOCUMENTS

2007/0236618 A1* 10/2007 Maag ............... G06F 3/041
349/12
2009/0085891 A1* 4/2009 Yang ............... G06F 3/044
345/174

(Continued)

FOREIGN PATENT DOCUMENTS

JP 2013-037484 A 2/2013
JP 2013-210938 A 10/2013

(Continued)

OTHER PUBLICATIONS

International Search Report for International Application No. PCT/JP2017/007883 dated May 23, 2017.

*Primary Examiner* — Alexander Eisen
*Assistant Examiner* — Nelson Lam
(74) *Attorney, Agent, or Firm* — Beyer Law Group LLP

(57) ABSTRACT

A capacitive sensor has: an electrode link that has a plurality of second transparent electrodes arranged in a predetermined direction; a first wiring part electrically connected to one end of the electrode link; a second wiring part electrically connected to another end of the electrode link; a central linking part that electrically connects a plurality of second transparent electrodes placed at the central portion of the detection area in the predetermined direction; and a peripheral linking part that electrically connects a plurality of second transparent electrodes placed in other than the central portion in the predetermined direction. The first wiring part and second wiring part are electrically connected to each other in a non-detection area. The electric resistance value of the central linking part is higher than the electric resistance value of the peripheral linking part.

11 Claims, 10 Drawing Sheets

(58) Field of Classification Search
USPC .................................................. 345/173–179
See application file for complete search history.

(56) References Cited

U.S. PATENT DOCUMENTS

| | | | | |
|---|---|---|---|---|
| 2012/0182230 | A1* | 7/2012 | Wang | ........................ G06F 3/044 |
| | | | | 345/173 |
| 2013/0181925 | A1* | 7/2013 | Kim | ........................ G06F 3/044 |
| | | | | 345/173 |
| 2013/0312253 | A1* | 11/2013 | Chien | ..................... G06F 3/041 |
| | | | | 29/622 |
| 2014/0204283 | A1* | 7/2014 | Huh | ....................... G06F 3/0446 |
| | | | | 349/12 |
| 2014/0368755 | A1* | 12/2014 | Chen | ........................ G06F 3/044 |
| | | | | 349/12 |
| 2015/0234425 | A1* | 8/2015 | Kim | ................. G02F 1/136286 |
| | | | | 345/174 |
| 2019/0220117 | A1* | 7/2019 | Yamai | ..................... G01D 5/24 |

FOREIGN PATENT DOCUMENTS

| JP | 2013-225250 A | 10/2013 |
|---|---|---|
| JP | 2014-153790 A | 8/2014 |

* cited by examiner

CAPACITIVE SENSOR SUPPRESSING BREAKAGE OF ELECTRODE LINKING PARTS DUE TO ELECTROSTATIC DISCHARGE

CLAIM OF PRIORITY

This application is a Continuation of International Application No. PCT/JP2017/007883 filed on Feb. 28, 2017, which claims benefit of Japanese Patent Application No. 2016-083900 filed on Apr. 19, 2016. The entire contents of each application noted above are hereby incorporated by reference.

BACKGROUND OF THE INVENTION

1. Field of the Invention

The present invention relates to a capacitive sensor, and more particularly to a capacitive sensor in which wiring parts are led out from both sides of an electrode link formed on a base material and the wiring parts on both sides are electrically connected to each other in a non-detection area.

2. Description of the Related Art

Japanese Unexamined Patent Application Publication No. 2013-210938 discloses a capacitive input device in which wiring parts are led out from both sides of a plurality of transparent electrodes formed on a base material and the wiring parts on both sides are electrically connected to each other in a peripheral area positioned around an input area. The plurality of transparent electrodes described in Japanese Unexamined Patent Application Publication No. 2013-210938 are electrically connected through linking parts. With the capacitive input device described in Japanese Unexamined Patent Application Publication No. 2013-210938, even a capacitive input device placed in a relatively wide area, such as, for example, an on-vehicle sensor mounted in a car navigation device can reduce electric resistance and can make a time to store charges. Therefore, it is possible to obtain a superior responsiveness for a coordinate input or a gesture manipulation.

SUMMARY OF THE INVENTION

However, if an electro static discharge (ESD) occurs in, for example, a manufacturing process, electricity generated due to the ESD may flow into a linking part. Then, at least any of local thermal expansion and thermal contraction may occur in the linking part and damage to wire breakage may occur.

If a linking part that electrically connects a plurality of transparent electrodes placed in other than the central portion of an input area (for example, at an end) is broken, the breakage at the linking part may affect the detection operation of the capacitive input device. That is, if a linking part placed in other than the central portion of the input area (for example, at an end) is broken, the transparent electrodes placed at both ends of the broken linking part have mutually different electrical resistance values and the relevant linking parts also have mutually different electrical resistance values. Specifically, on a side on which the number of transparent electrodes and linking parts that are electrically connected is relatively small (on a side on which connection lengths are relatively short), electric resistance values are relatively small. By contrast, on a side on which the number of transparent electrodes and linking parts that are electrically connected is relatively large (on a side on which connection lengths are relatively long), electric resistance values are relatively large.

Then, the time to store charges differs between both sides of the broken linking part. Specifically, on the side on which the number of transparent electrodes and linking parts that are electrically connected is relatively small (on the side on which connection lengths are relatively short), the time to store charges is relatively early. By contrast, on the side on which the number of transparent electrodes and linking parts that are electrically connected is relatively large (on the side on which connection lengths are relatively long), the time to store charges is relatively late.

Therefore, if a linking part placed in other than the central portion of the input area is broken, the responsiveness, that is, time constant of the capacitive input device, that is, time constant, differs between both sides of the broken linking part. If a linking part placed in other than the central portion of the input area is broken as described above, an imbalance in time constant occurs between both sides of the broken linking part. Thus, the breakage of a linking part due to an ESD may affect the detection operation of the capacitive input device.

The present invention provides a capacitive sensor that can suppress the effect of the breakage of a linking part due to an ESD on detection operation.

In one aspect, a capacitive sensor in the present invention is characterized by having: a base material that has a translucent property; an electrode link that has a plurality of transparent electrodes, each of which has a translucent property, the plurality of transparent electrodes being arranged in a detection area on the base material in a predetermined direction; a first wiring part disposed so as to extend to a non-detection area outside the detection area, the first wiring part being electrically connected to one end of the electrode link; a second wiring part disposed so as to extend to the non-detection area outside the detection area, the second wiring part being electrically connected to another end of the electrode link; a central linking part that electrically connects a plurality of transparent electrodes placed in a central portion in the detection area in the predetermined direction; and a peripheral linking part that electrically connects a plurality of transparent electrodes placed in other than the central portion in the detection area in the predetermined direction. The capacitive sensor is also characterized in that the first wiring part and the second wiring part are electrically connected to each other in the non-detection area and that the electric resistance value of the central linking part is higher than the electric resistance value of the peripheral linking part.

In the capacitive sensor described above, the first wiring part, which is electrically connected to one end of the electrode link that has a plurality of transparent electrodes, is electrically connected to the second wiring part, which is connected to another end of the electrode link, in the non-detection area. The electric resistance value of the central linking part, which electrically connects a plurality of transparent electrodes placed in the central portion of the detection area in a predetermined direction in which a plurality of transparent electrodes are arranged, is higher than the electric resistance value of the peripheral linking part, which electrically connects a plurality of transparent electrodes placed in other than the central portion in the predetermined direction.

Due to this, the amount of voltage drop caused in the central linking part by an ESD is larger than the amount of voltage drop caused in the peripheral linking part by the ESD. Therefore, the amount of heat generated in the central linking part by the ESD is larger than the amount of heat generated in the peripheral linking part by the ESD. Therefore, if an ESD occurs, the central linking part is likely to be preferentially broken when compared with the peripheral linking part. That is, wire breakage caused by an ESD can be concentrated on the central linking part.

The central linking part is positioned distant from both the first wiring part and the second wiring part. In the central linking part, charges are less likely to flow when compared with the peripheral linking part. Therefore, even in a state in which the central linking part is not broken, the storage of charges into a transparent electrode connected to one end of the central linking part is performed dominantly from the first wiring part side and the storage of charges into a transparent electrode connected to another end of the central linking part is performed dominantly from the second wiring part side. Therefore, even if an ESD occurs and the central linking part is thereby broken, a large change does not occur in a process to store charges into two transparent electrodes connected to both ends of the central linking part, one to each end. In other words, there is no large difference in time constants of the two transparent electrodes connected to both ends of the central linking part, one to each end, regardless of whether the central linking part is broken or not. Therefore, by taking a structure so that wire breakage due to an ESD concentrates on the central linking part, it is possible to suppress the effect of an ESD on the detection operation of the capacitive sensor.

Since the electric resistance value of the central linking part is higher than the electric resistance value of the peripheral linking part, in a structure in which wire breakage due to an ESD concentrates on the central linking part, if the peripheral linking part beaks for some reason, the time constant of the transparent electrode that has been connected to the broken peripheral linking part becomes particularly higher than the time constants of any other transparent electrodes. That is, the time constant of the transparent electrode that has been connected to the broken becomes a singular point. Therefore, even if the peripheral linking part is broken due to an ESD in, for example, a manufacturing process, the breakage of a peripheral linking part can be easily detected in the manufacturing process.

In the capacitive sensor described above, the width of the central linking part may be smaller than the width of the peripheral linking part. In this case, the electric resistance value of the central linking part can be relatively easily made higher than the electric resistance value of the peripheral linking part in a process to form the central linking part and peripheral linking parts. Therefore, it is possible to relatively easily suppress the effect of the breakage of a linking part due to an ESD on the detection operation of the capacitive sensor.

In the capacitive sensor described above, the thickness of the central linking part may be smaller the thickness of the peripheral linking part. In this case as well, the electric resistance value of the central linking part can be relatively easily made higher than the electric resistance value of the peripheral linking part in a process to form the central linking part and peripheral linking parts. Therefore, it is possible to relatively easily suppress the effect of the breakage of a linking part due to an ESD on the detection operation of the capacitive sensor.

In the capacitive sensor described above, the central linking part may include a material that has electric resistivity higher than the electric resistivity of the material of the peripheral linking part. In this case, the electric resistance value of the central linking part can be made higher than the electric resistance value of the peripheral linking part not by the shapes of the central linking part and peripheral linking part but by the materials of the central linking part and peripheral linking part. Therefore, it is possible to more reliably suppress the effect of the breakage of a linking part due to an ESD on the detection operation of the capacitive sensor.

DESCRIPTION OF THE PREFERRED EMBODIMENTS

Figure 1:
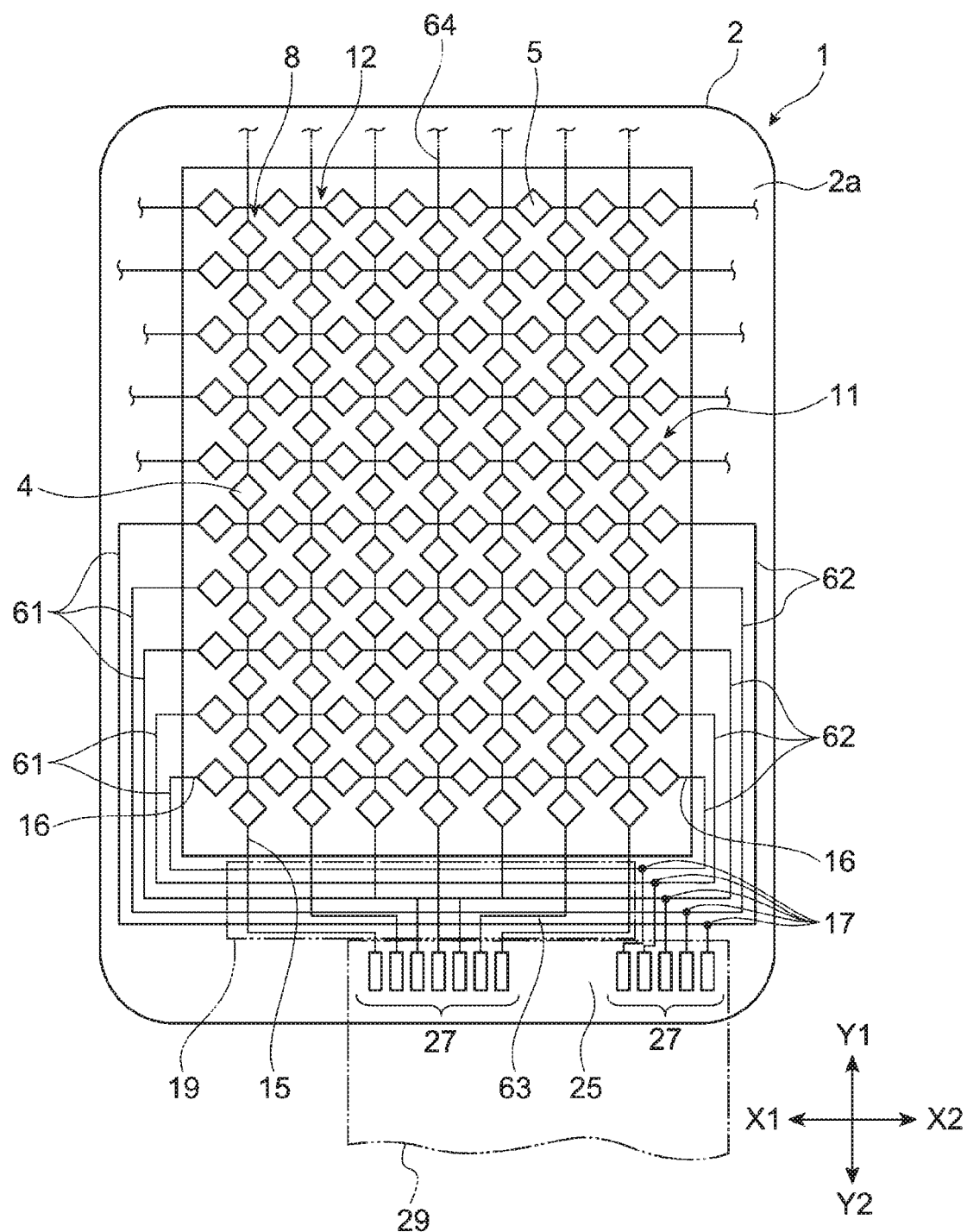
FIG. 1 is a plan view that illustrates a capacitive sensor according to an embodiment.

An embodiment of the present invention will be described with reference to the drawings. In the drawings, like elements are assigned like reference characters and detailed descriptions will be appropriately omitted.

Figure 2:
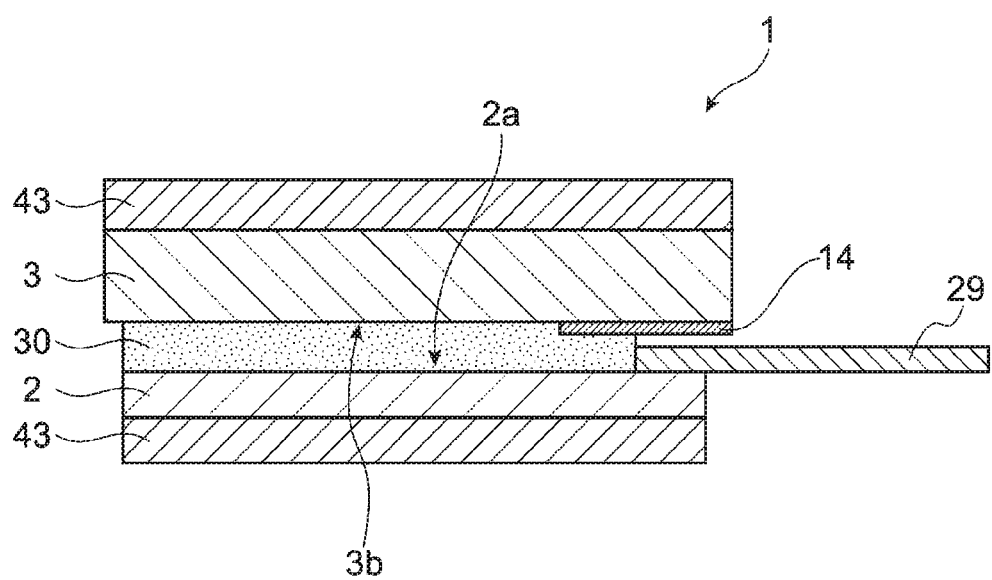
FIG. 2 is a cross-sectional view that schematically illustrates the capacitive sensor according to the embodiment.
Figure 3:
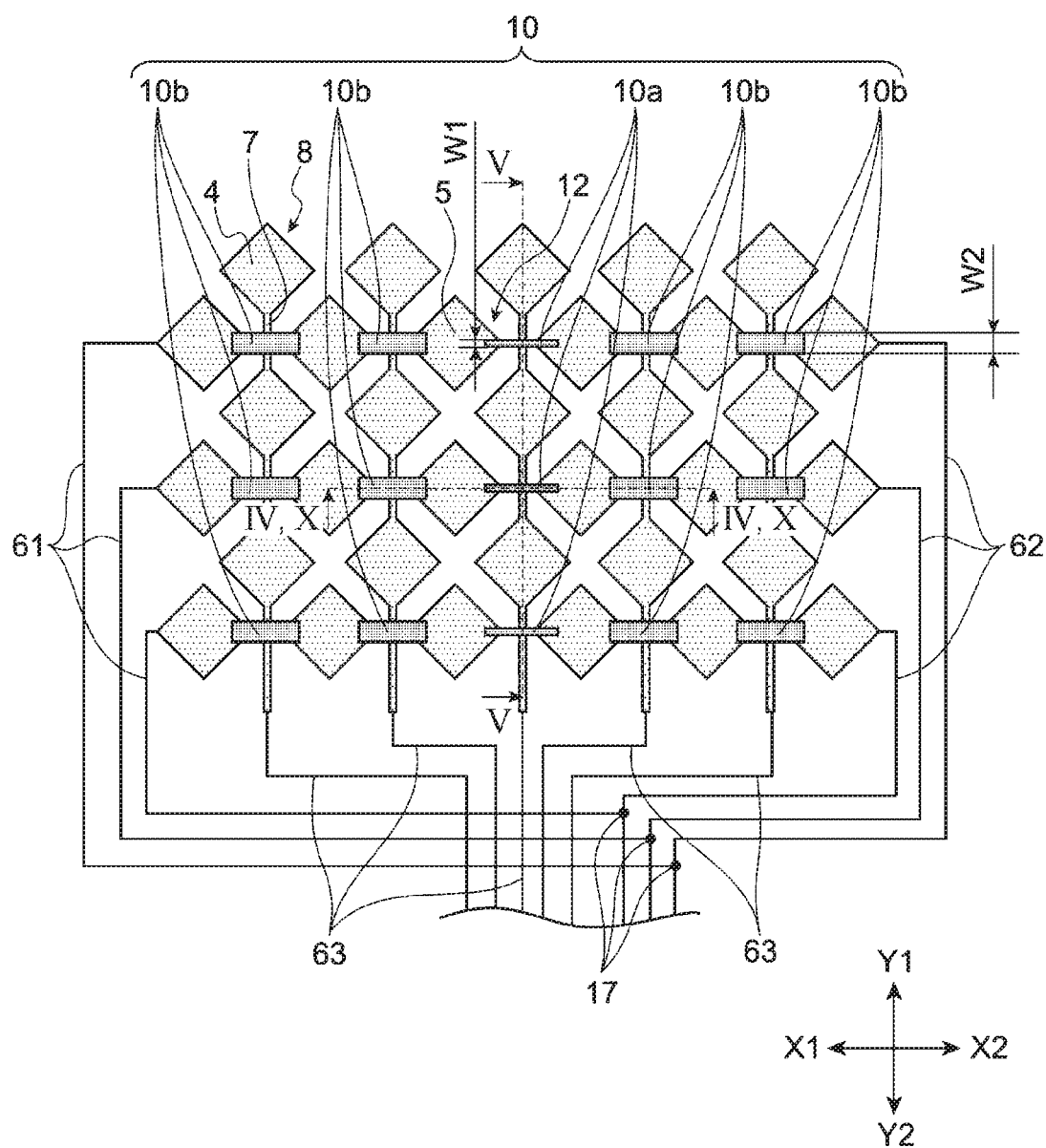
FIG. 3 is a plan view that illustrates the placement of electrodes provided on a base material in the embodiment.
Figure 4:
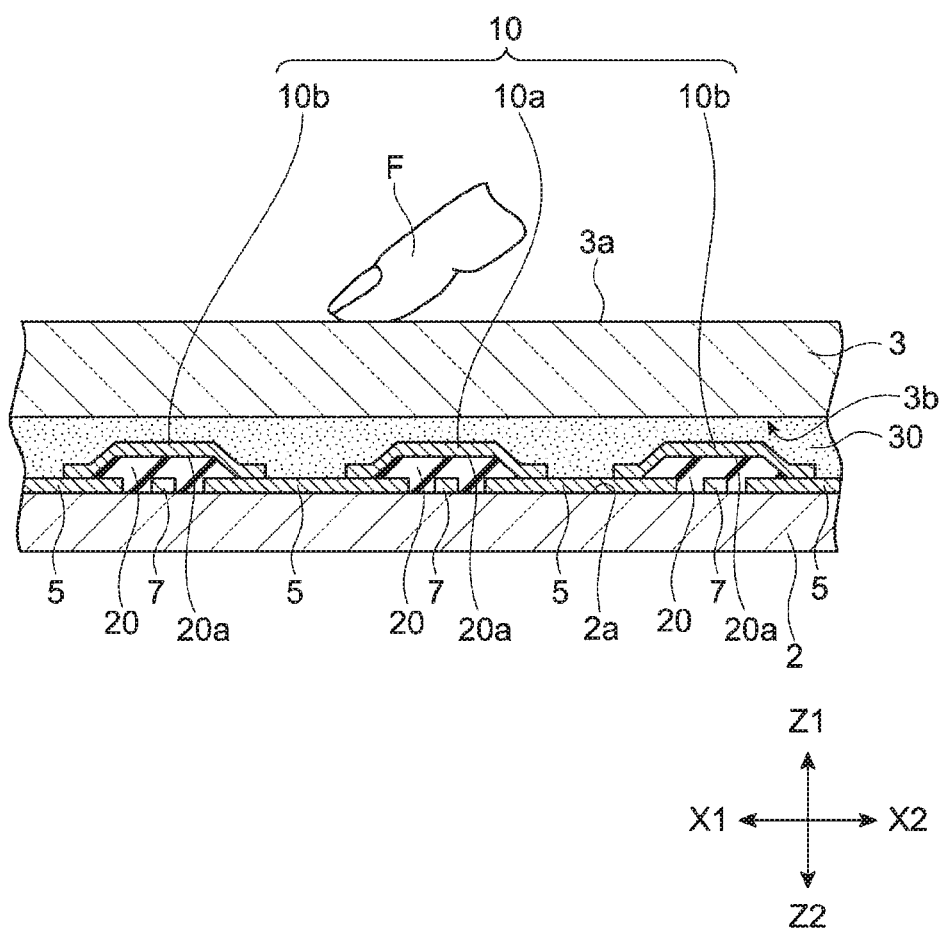
FIG. 4 is a cross-sectional view taken along line IV-IV indicated in FIG. 3.
Figure 5:
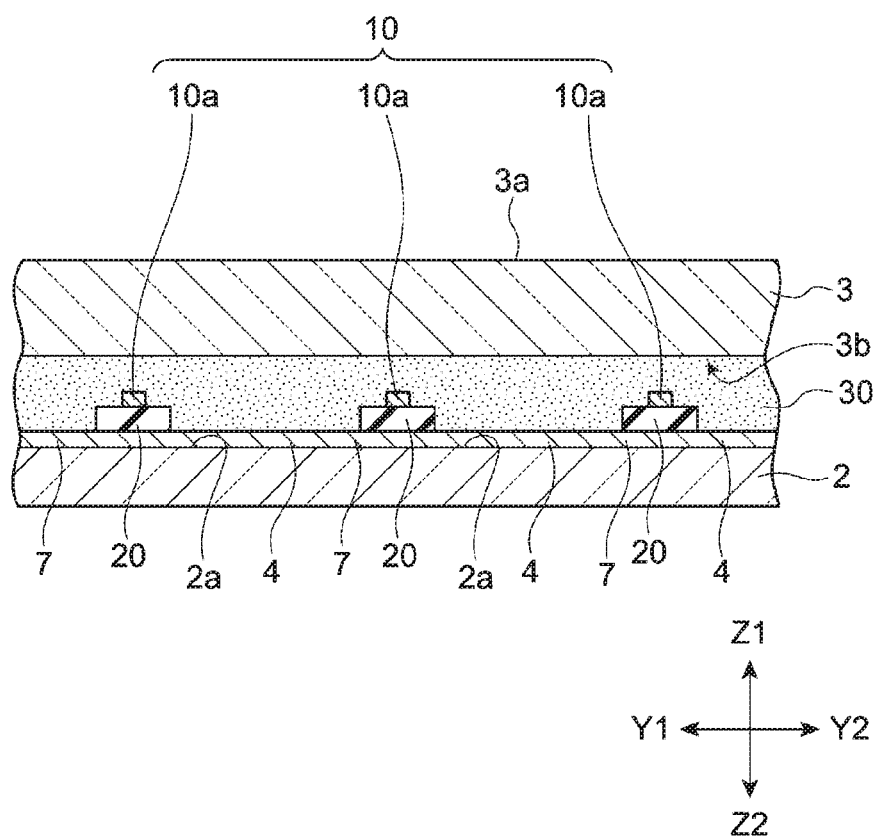
FIG. 5 is a cross-sectional view taken along line V-V indicated in FIG. 3.

FIG. 1 is a plan view that illustrates a capacitive sensor according to this embodiment. FIG. 2 is a cross-sectional view that schematically illustrates the capacitive sensor according to this embodiment. FIG. 3 is a plan view that illustrates the placement of electrodes provided on a base material in this embodiment. FIG. 4 is a cross-sectional view taken along line IV-IV indicated in FIG. 3. FIG. 5 is a cross-sectional view taken along line V-V indicated in FIG. 3. Since a transparent electrode is transparent, it cannot be viewed in reality. In FIGS. 1 and 3, however, the outline shapes of transparent electrodes are illustrated for easy understanding.

In this application, "transparency" and "translucent property" indicate a state in which visible light transmittance is 50% or higher (preferably, 80% or higher). Furthermore, it is preferable for the haze value to be 6% or lower. In this application, "light shielding" and "light shielding property" indicate a state in which visible light transmittance is lower than 50% (preferably, lower than 20%).

As illustrated in FIGS. 1 and 2, the capacitive sensor 1 according to this embodiment has a base material 2, an optical transparent adhesive layer 30, and a panel 3. As illustrated in FIG. 2, the base material 2, optical transparent adhesive layer 30, and panel 3 are laminated in that order. That is, the optical transparent adhesive layer 30 is disposed between the base material 2 and the panel 3. In the manufacturing process of the capacitive sensor 1, the main surfaces of the base material 2 and panel 3 are covered with, for example, a protective sheet 43.

The base material 2 has a translucent property and is formed from a film-like transparent base material such as polyethylene terephthalate (PET), a glass base material, or the like. Transparent electrodes and the like are provided on one main surface of the base material 2, as described later in detail. The panel 3 has a translucent property. The material of the panel 3 is not particularly restricted. As the material of the panel 3, a glass base material and a plastic base material are preferably used. The panel 3 is bonded to the base material 2 with an optical clear adhesive (OCA) 30 provided between the base material 2 and the panel 3. The optical clear adhesive (OCA) 30 is composed of an acrylic adhesive, a double-sided adhesive tape, or the like.

As illustrated in FIG. 1, the capacitive sensor 1 is composed of a detection area 11 and a non-detection area 25 when viewed from a direction (Z1-Z2 direction) along the normal of a surface of the panel 3. On the detection area 11, a manipulation can be performed with a manipulation body such as a finger F. The non-detection area 25, shaped like a picture frame, is positioned outside the outer circumference of the detection area 11. The non-detection area 25 is light-shielded by a decorative layer 14 (see FIG. 2) disposed on a main surface of the panel 3. In the capacitive sensor 1, light (exemplified by external light) that propagates from a surface of the panel 3 toward a surface of the base material 2 and light (exemplified by light from a backlight of a display device used in combination with the capacitive sensor 1) that propagates from the surface of the base material 2 toward the surface of the panel 3 are less likely to pass through the non-detection area 25.

As illustrated in FIGS. 1 and 3, FIG. 4 (cross-sectional view taken along line IV-IV indicated in FIG. 3) and FIG. 5 (cross-sectional views taken along line V-V indicated in FIG. 3), first electrode links 8 and second electrode links 12 are provided on one main surface of the base material 2. The first electrode links 8 are placed in the detection area 11. Each first electrode link 8 has a plurality of first transparent electrodes 4. As illustrated in FIG. 3, the plurality of first transparent electrodes 4, disposed as illustrated in FIG. 3, are disposed on a main surface (sometimes simply referred to below as the front surface) 2a, which is one of the main surfaces of the base material 2 and is positioned on the Z1 side, the normal of the main surfaces being along the Z1-Z2 direction. The first transparent electrodes 4 are linked through elongated first linking parts 7 in the Y1-Y2 direction (first direction). The first electrode links 8, each of which has a plurality of first transparent electrodes 4 linked in the Y1-Y2 direction, are arranged in the X1-X2 direction at intervals. The first linking part 7 is formed integrally with the first transparent electrode 4.

The first transparent electrode 4 and first linking part 7 are formed from a transparent conductive material such as an indium tin oxide (ITO) by sputtering, evaporation, or the like. Besides the ITO material, transparent conductive materials include metal nanowires typified by silver nanowires, thin metals formed in a mesh shape, and conductive polymers. This is also true for transparent conductive materials described later.

The second electrode links 12 are placed in the detection area 11. Each second electrode link 12 has a plurality of second transparent electrodes 5. As illustrated in FIG. 4, the plurality of second transparent electrodes 5, disposed as illustrated in FIG. 3, are disposed on the front surface 2a of the base material 2. Thus, the second transparent electrodes 5 are disposed on the same surface (front surface 2a of the base material 2) as the first transparent electrodes 4. As illustrated in FIGS. 4 and 5, the second transparent electrodes 5 are linked through elongated second linking parts 10 in the X1-X2 direction (second direction). The second electrode links 12, each of which has a plurality of second transparent electrodes 5 linked in the X1-X2 direction, are arranged in the Y1-Y2 direction at intervals. The second linking part 10 is formed separately from the second transparent electrode 5. The X1-X2 direction crosses the Y1-Y2 direction. For example, the X1-X2 direction perpendicularly crosses the Y1-Y2 direction.

The second transparent electrode 5 is formed from a transparent conductive material such as an ITO material by sputtering, evaporation, or the like. The second linking part 10 is formed from a transparent conductive material such as an ITO material. Alternatively, the second linking part 10 may have a first layer including a transparent conductive material such as an ITO material and a second layer composed of a metal that has a lower resistance than the first layer and is transparent. If the second linking part 10 has a laminated structure composed of the first layer and second layer, it is preferable for the second layer to be formed from any one selected from a group of Au, an Au alloy, CuNi, and Ni. Of these, selection of Au is more preferable. If the second layer is formed from Au, the second linking part 10 can obtain a superior resistance to an environment (moisture resistance and heat resistance).

As illustrated in FIGS. 4 and 5, an insulative layer 20 is disposed on the front surface of the first linking part 7, which links first transparent electrodes 4. As illustrated in FIG. 4, the insulative layer 20 fills space between the first linking part 7 and the second transparent electrode 5 and also slightly rides on the front surface of the second transparent electrode 5. As the insulative layer 20, a novolak resin (resist), for example, is used.

As illustrated in FIGS. 4 and 5, the second linking part 10 is disposed so as to extend from the front surface 20a of the insulative layer 20 to the front surfaces of the second transparent electrodes 5 positioned at both sides of the insulative layer 20 in the X1-X2 direction. The second linking part 10 electrically connects second transparent electrodes 5.

As illustrated in FIGS. 4 and 5, the insulative layer 20 is disposed on the front surface of the first linking part 7, which links first transparent electrodes 4, and the second linking part 10, which connects second transparent electrode 5, is disposed on the front surface of the insulative layer 20. Thus, the insulative layer 20 is present between the first linking part 7 and the second linking part 10, so the first transparent electrode 4 and second transparent electrode 5 are electrically insulated from each other. Since, in this embodiment, the first transparent electrode 4 and second transparent electrode 5 are disposed on the same surface (front surface 2a of the base material 2), the capacitive sensor 1 can be thinned.

In examples of the placement of the linking parts illustrated in FIGS. 3, 4, and 5, the first linking part 7 is integrally formed as part of the first transparent electrode 4, and the second linking part 10 is formed on the front surface 20a of the insulative layer 20, which covers the first linking part 7, separately from the second transparent electrode 5. That is, the second linking part 10 is provided as a bridge wire. However, forms of the placement of these linking parts are not limited to this. For example, the first linking part 7 may be formed on the front surface 20a of the insulative layer 20 separately from the first transparent electrode 4 and the second linking part 10 may be integrally formed as part of the second transparent electrode 5. That is, the first linking part 7 may be provided as a bridge wire. In the explanation of the capacitive sensor 1 according to this embodiment, a case in which the second linking part 10 is provided as a bridge wire will be taken as an example.

As illustrated in FIGS. 3 and 4, first second linking parts 10 include a central linking part 10a and peripheral linking parts 10b. The central linking part 10a electrically connects a plurality of second transparent electrodes 5 placed at the central portion of the detection area 11 in the X1-X2 direction in which the second electrode link 12 extends. Each peripheral linking part 10b electrically connects a plurality of second transparent electrodes 5 placed in other than the central portion of the detection area 11 (for example, ends) in the X1-X2 direction in which the second electrode link 12 extends.

The first linking part 7, second linking part 10, and insulative layer 20, which are all positioned in the detection area 11, have a translucent property as are the first transparent electrode 4 and second transparent electrode 5.

As illustrated in FIGS. 1 and 2, first wiring parts 61, second wiring parts 62, and third wiring parts 63 are formed in the non-detection area 25. Each first wiring part 61 and each second wiring part 62 are led out from ends at both sides of the second electrode link 12, one from each end. Specifically, the first wiring part 61 is led out from one end (end on the X1 side) of the second electrode link 12 and extends toward one end (end on the X1 side) of the non-detection area 25. The first wiring part 61 is electrically connected to the one end of the second electrode link 12. The second wiring part 62 is led out from another end (end on the X2 side) of the second electrode link 12 and extends toward another end (end on the X2 side) of the non-detection area 25. The second wiring part 62 is electrically connected to the other end of the second electrode link 12.

The third wiring part 63 is led out from one end of the first electrode link 8. Specifically, the third wiring part 63 is led out from one end (end on the Y2 side) of the first electrode link 8 and extends toward one end (end on the Y2 side) of the non-detection area 25. The third wiring part 63 is electrically connected to the one end of the first electrode link 8.

As illustrated in FIG. 1, the second electrode link 12 is electrically connected to the first wiring part 61 and second wiring part 62 through a connection wire 16. The first wiring part 61 and second wiring part 62 are electrically connected to each other at a contact part 17 provided in the non-detection area 25 and is also electrically connected to an external connection part 27, which is electrically connected to a flexible printed circuit board 29. That is, the first wiring part 61 and second wiring part 62 are electrically connected to each other and also connect the second electrode link 12 and external connection part 27 together.

The first electrode link 8 is electrically connected to the third wiring part 63 through a connection wire 15. The third wiring part 63 is connected to the external connection part 27, which is electrically connected to the flexible printed circuit board 29. That is, the third wiring part 63 electrically connects the first electrode link 8 and external connection part 27 together. The external connection part 27 is electrically connected to the flexible printed circuit board 29 through, for example, a conductive paste.

An insulative layer 19 is provided between the first wiring part 61 and the third wiring part 63. For example, the insulative layer 19 is formed on the front surface of the third wiring part 63. Like this, since the insulative layer 19 is present between the first wiring part 61 and the third wiring part 63, the first wiring part 61 and third wiring part 63 are electrically insulated from each other and the second wiring part 62 and third wiring part 63 are also electrically insulated from each other.

The wiring parts 61, 62, and 63 are formed from a material that has a metal such as Cu, a Cu alloy, a CuNi alloy, Ni, Ag, Au, or the like. The connection wires 15 and 16, which are formed from a transparent conductive material such as an ITO material, extend from the detection area 11 to the non-detection area 25. The first wiring part 61 and second wiring part 62 are laminated on the connection wire 16 in the non-detection area 25 and are electrically connected to the connection wire 16. The third wiring part 63 is laminated on the connection wire 15 in the non-detection area 25 and is electrically connected to the connection wire 15.

The wiring parts 61, 62, and 63 are disposed in the non-detection area 25 on the front surface 2a of the base material 2. The external connection part 27 is also disposed in the non-detection area 25 on the front surface 2a of the base material 2, as are the wiring parts 61, 62, and 63.

Although, in FIG. 1, the wiring parts 61, 62 and 63 and the external connection part 27 are illustrated so as to be viewed for easy understanding, the panel 3 is disposed so as to face the front surface 2a of the base material 2 in practice, as illustrated in FIGS. 2, 4, and 5. Of the main surfaces of the panel 3, their normal being along the Z1-Z2 direction, a main surface (opposite to a main surface 3b facing the front surface 2a of the base material 2) 3a positioned on the Z1 side is on a surface on a side on which the capacitive sensor 1 is manipulated. Therefore, the manipulation surface 3a is also referred to as the manipulation surface in this description.

The panel 3 may have a laminated structure. Specific examples of laminated structures include a laminated structure in which a hard coat layer formed from an inorganic material is formed on a film formed from an organic material. The shape of the panel 3 may be a flat-plate-like shape or may be another shape. For example, the manipulation surface 3a of the panel 3 may be a curved surface. The manipulation surface 3a and main surface 3b of the panel 3 may have different shapes; of the main surfaces of the panel 3 that have a normal along the Z1-Z2 direction, the main surface 3b is positioned on the Z2 side (in other words, the main surface 3b is opposite to the manipulation surface 3a, so the main surface 3b may also be referred to below as the rear surface).

The decorative layer 14 that has a shielding property is disposed in the non-detection area 25 on the rear surface 3b of the panel 3, as illustrated in FIG. 2. In the capacitive sensor 1 according to this embodiment, the decorative layer 14 is disposed in the whole of the portion positioned in the non-detection area 25 on the rear surface 3b of the panel 3. Therefore, the wiring parts 61, 62 and 63 and the external connection parts 27 are hidden by the decorative layer 14 and are not viewed when the capacitive sensor 1 is viewed from the same side as the manipulation surface 3a of the panel 3. The material of the decorative layer 14 is any material if it has a shielding property. The decorative layer 14 may have an insulation property.

With the capacitive sensor 1 illustrated in FIG. 1, when the finger F used as an example of a manipulation body comes into contact with the manipulation surface 3a of the panel 3 as illustrated in FIG. 4, a capacitance is generated between the finger F and the first transparent electrode 4 close to the finger F and between the finger F and the second transparent electrode 5 close to the finger F. The capacitive sensor 1 can calculate the contact position of the finger F according to a change in capacitance at that time. Specifically, the capacitive sensor 1 detects the X coordinate of the position of the finger F according to a change in capacitance between the finger F and the first electrode link 8 and detects the Y coordinate of the position of the finger F according to a change in capacitance between the finger F and the second electrode link 12 (the capacitive sensor 1 is of self-capacitance detection type).

Alternatively, the capacitive sensor 1 may be of mutual capacitance detection type. Specifically, the capacitive sensor 1 may apply a driving voltage to any one of the first electrode link 8 and second electrode link 12, and may detect a change in capacitance between the finger F and the other of the first electrode link 8 and the second electrode link 12. Due to this, the capacitive sensor 1 detects the X direction of the position of the finger F from one electrode link and also detects the Y coordinate of the position of the finger F from the other electrode link.

As described above, in the capacitive sensor 1 according to this embodiment, the first wiring part 61 and second wiring part 62 are led out from both ends of the second electrode link 12, one from each end, and are connected to the flexible printed circuit board 29. Due to this, the electric resistance value of the second electrode link 12 can be reduced and the time to store charges can be made early. Therefore, it is possible to obtain a superior responsiveness for a coordinate input or a gesture manipulation. That is, it is possible to suppress the time constant of the capacitive sensor 1 to a smaller value.

The placement of the first transparent electrodes 4 and second transparent electrodes 5 illustrated in FIGS. 1 and 3 is just an example and is not limited only to this. The capacitive sensor 1 is only required to be capable of detecting a change in capacitance between a manipulation body such as the finger F and a transparent electrode and calculating a position at which the manipulation body is in contact with the manipulation surface 3a. For example, the first transparent electrodes 4 and second transparent electrodes 5 may be disposed on the different main surfaces of the base material 2.

Figure 6:
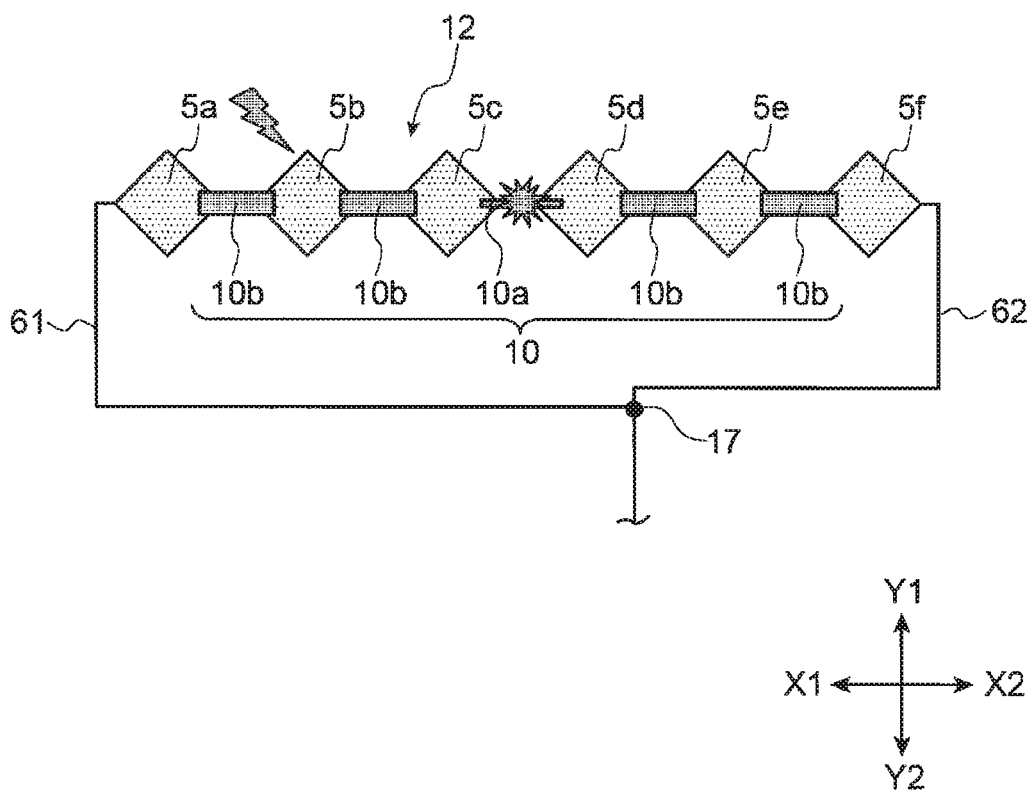
FIG. 6 is a plan view that exemplifies a case in which a central linking part in the embodiment is broken.
Figure 7:
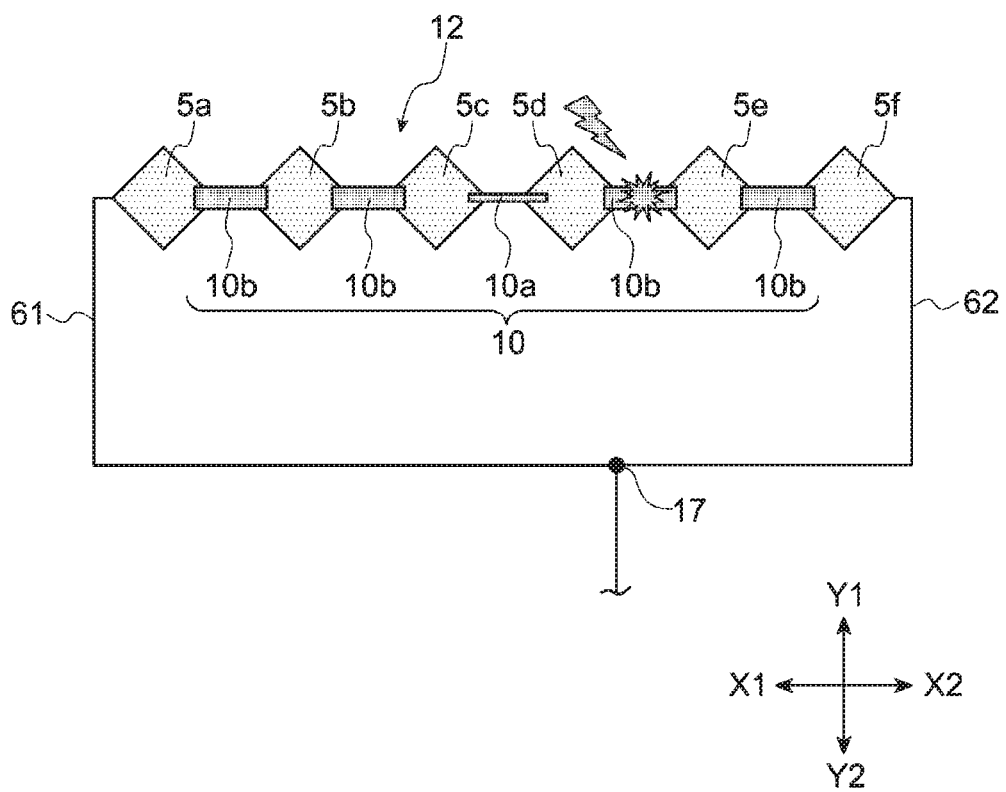
FIG. 7 is a plan view that exemplifies a case in which a peripheral linking part in the embodiment is broken.
Figure 8:
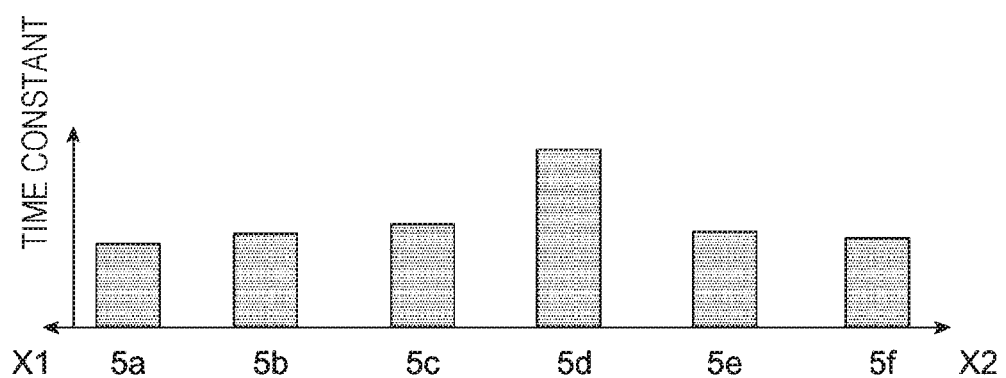
FIG. 8 is a graph that illustrates the time constants of second transparent electrodes.
Figure 9:
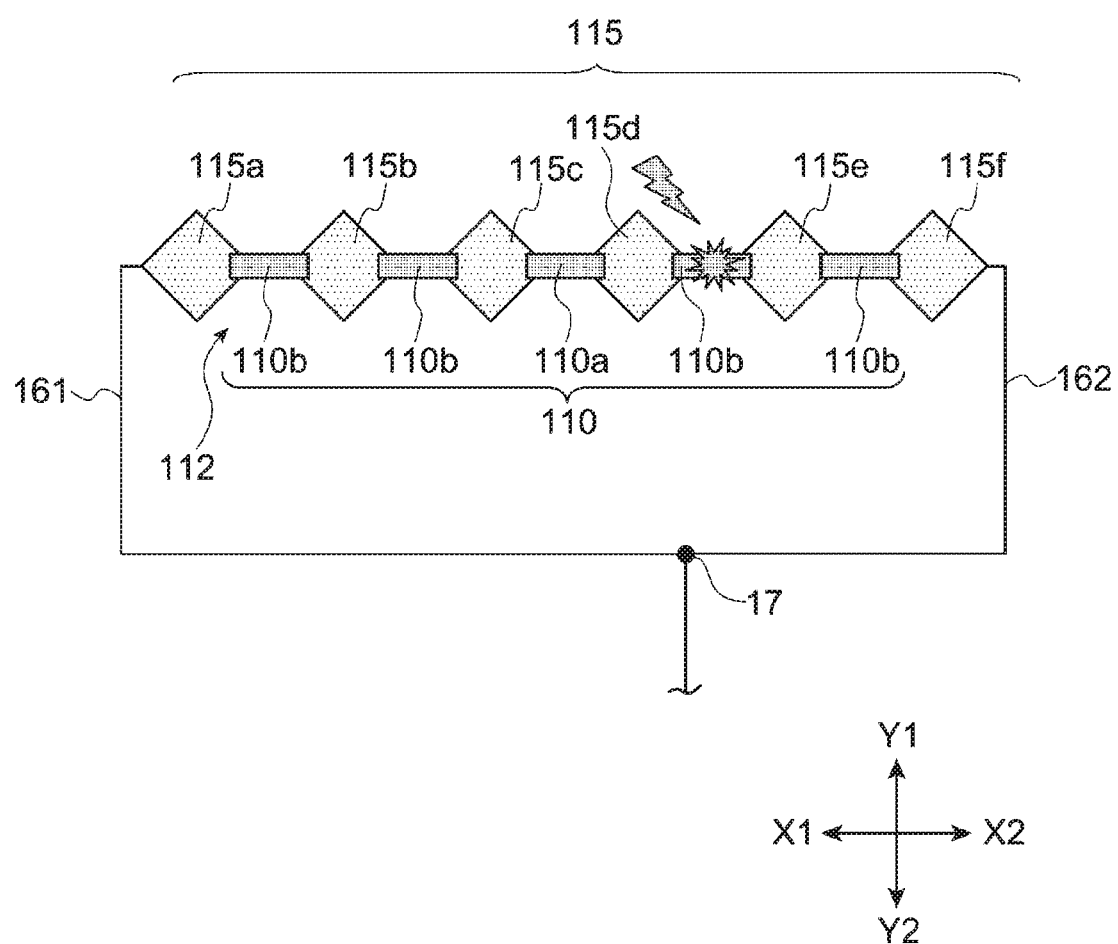
FIG. 9 a plan view that exemplifies a case in which a peripheral linking part in a comparative example is broken.

FIG. 6 is a plan view that exemplifies a case in which a central linking part in this embodiment is broken. FIG. 7 is a plan view that exemplifies a case in which a peripheral linking part in this embodiment is broken. FIG. 8 is a graph that illustrates the time constants of second transparent electrodes. FIG. 9 is a plan view that exemplifies a case in which a peripheral linking part in a comparative example is broken. In FIGS. 6 and 7, only one second electrode link 12 is illustrated for convenience of explanation. Reference symbols 5a to 5f described on the horizontal axis of the graph illustrated in FIG. 8 correspond to second transparent electrodes 5a to 5f illustrated in FIG. 7.

In a manufacturing process or the like, for example, an ESD may occur when the protective sheet 43 (see FIG. 2) is peeled. In this case, if an ESD occurs in a second electrode link 112 in a comparative example illustrated in FIG. 9, electricity caused by the ESD may flow into a second linking part 110. Then, at least any of local thermal expansion and thermal contraction may occur in the second linking part 110 and damage to wire breakage may thereby occur in the second linking part 110. Second linking parts 110 illustrated in FIG. 9 include a central linking part 110a and peripheral linking parts 110b. The central linking part 110a and peripheral linking part 110b have the same width, the same thickness, and the same material (that is, the same electric resistivity). That is, with the second electrode link 112 in the comparative example illustrated in FIG. 9, all second linking parts 110 (without a distinction between the central linking part 110a and the peripheral linking part 110b) are electrically equal.

A first wiring part 161 and a second wiring part 162 are led out from both ends of the second electrode link 112, one from each end, and are electrically connected at the contact part 17. Therefore, if an ESD occurs in the second electrode link 112 and electricity generated by the ESD flows into the second linking part 110, all of the central linking part 110a and peripheral linking parts 110b constituting the second linking parts 110 have the same possibility that wire breakage occurs. The second electrode link 112 in the comparative example illustrated in FIG. 9 has one central linking part 110a and four peripheral linking parts 110b. From the viewpoint of probability, therefore, wire breakage is highly likely to occur in any of the peripheral linking parts 110b when compared with the central linking part 110a.

If one second linking part 110 (specifically, peripheral linking part 110b) other than the central linking part 110a in the input area is broken, the breakage of the second linking part 110 may affect the detection operation of the capacitive sensor 1. About this point, a specific example will be described by using a case in which breakage occurs at the second linking part 110, of five second linking parts 110 arranged in the X1-X2 direction, at the second position from the X2 side (that is, the second linking part 110 is the peripheral linking part 110b positioned between two second transparent electrodes, 115d and 115e), as illustrated in FIG. 9.

In a state before the peripheral linking part 110b at the second position from the X2 side is broken, since this peripheral linking part 110b is positioned closer to a second wiring part 162 than to the first wiring part 161, the storage of charges into two second transparent electrodes, 115d and 115e, which are connected to both ends of this peripheral linking part 110b, one to each end, is performed dominantly from the second wiring part 162. That is, after the storage of charges into the second transparent electrode 115e connected to the X2 side of the peripheral linking part 110b at the second position from the X2 side, charges are stored into the second transparent electrode 115d connected to the X1 side of this peripheral linking part 110b. As a result, a shift in the time to store charges occurs between the second transparent electrode 115d and second transparent electrode 115e that are connected to both end of the peripheral linking part 110b at the second position from the X2 side, one to each end. Usually, this shift in the time to store charges is individually corrected by a controller (not illustrated) for the capacitive sensor 1, so a smooth manipulation feeling of the capacitive sensor 1 is achieved.

In the case of the breakage of the peripheral linking part 110b at the second position from the X2 side, however, charges are stored from the first wiring part 161 into the second transparent electrode 115d, which has been connected to the X1 side of the broken peripheral linking part 110b. Therefore, the storage of charges into the second transparent electrode 115d is performed through the storage of charges into three second transparent electrodes, 115a to 115c, positioned closer to the X1 side than is this second transparent electrode 115d. By contrast, charges are stored into the second transparent electrode 115e, which has been connected to the X2 side of the broken peripheral linking part 110b, from the second wiring part 162. Therefore, the storage of charges into this second transparent electrode 115e is performed through the storage of charges into only one second transparent electrode denoted 115*f*, positioned closer to the X2 side than is this second transparent electrode 115*e*. Accordingly, a shift in the time to store charge at two second transparent electrodes, 115*d* and 115*e*, which have been connected to both ends of the broken peripheral linking part 110*b*, one to each end, largely differs from the time to store charges in the state before the peripheral linking part 110*b* is broken.

If, as described above, a shift in the time to store charges at two adjacently positioned second transparent electrodes 115 (in the specific example illustrated in FIG. 9, second transparent electrode 115*d* and second transparent electrode 115*e*) changes due to the breakage of the peripheral linking part 110*b* positioned between the two second transparent electrodes 115, the change may become prominent as a difference in responsiveness, that is, time constant of the capacitive sensor. Specifically, when the capacitive sensor 1 is manipulated with a manipulation body such as the finger F, responsiveness may locally change in a portion in which a difference in time constant has become prominent due to the breakage of the peripheral linking part 110*b*. This may lose a smooth manipulation feeling of the capacitive sensor 1.

In contrast to this, in the capacitive sensor 1 according to this embodiment, the electric resistance value of the central linking part 10*a* is higher than the electric resistance value of the peripheral linking part 10*b*. Specifically, the width W1 of each central linking part 10*a* is preferably smaller than the width W2 of the peripheral linking part 10*b* as illustrated in FIG. 3. Therefore, the electric resistance value of the central linking part 10*a* becomes higher than the electric resistance value of the peripheral linking part 10*b*.

Due to this, the amount of voltage drop caused in the central linking part 10*a* by an ESD is larger than the amount of voltage drop caused in the peripheral linking part 10*b* by the ESD. Therefore, the amount of heat generated in the central linking part 10*a* by the ESD is larger than the amount of heat generated in the peripheral linking part 10*b* by the ESD. Therefore, if an ESD occurs as illustrated in FIG. 6, the central linking part 10*a* is likely to be preferentially broken when compared with the peripheral linking part 10*b*. That is, with the second electrode link 12 illustrated in FIG. 6, a second linking part 10 in which wire breakage occurs due to an ESD can be concentrated on the central linking part 10*a*, unlike the second electrode link 112 illustrated in FIG. 9.

The central linking part 10*a* is positioned distant from both the first wiring part 61 and the second wiring part 62. In the central linking part 10*a*, charges are less likely to flow when compared with other second linking parts 10, that is, the peripheral linking parts 10*b*. Therefore, even in a state in which the central linking part 10*a* is not broken, the storage of charges into the second transparent electrode 5*c* connected to the end of the central linking part 10*a* on the X1 side is performed dominantly from the first wiring part 61 and the storage of charges into the second transparent electrode 5*d* connected to the end of the central linking part 10*a* on the X2 side is performed dominantly from the second wiring part 62.

If an ESD occurs in the second electrode link 12 illustrated in FIG. 6, the central linking part 10*a* is preferentially broken as described above. In a state in which the central linking part 10*a* is broken, the storage of charges into the second transparent electrode 5*c*, which has been connected to the end of the central linking part 10*a* on the X1 end, is performed from the first wiring part 61 and the storage of charges into the second transparent electrode 5*d*, which has been connected to the end of the central linking part 10*a* on the X2 side, is performed from the second wiring part 62.

Therefore, even if an ESD occurs and the central linking part 10*a* is thereby broken, a large change does not occur in a process to store charges into two second transparent electrodes, 5*c* and 5*d*, which are connected to both ends of the central linking part 10*a*, one to each end (regardless of whether the charging is performed from the first wiring part 61 or second wiring part 62). In other words, there is no large difference in time constants of two second transparent electrodes, 5*c* and 5*d*, which are connected to both ends of the central linking part 10*a*, one to each end, regardless of whether the central linking part 10*a* is broken or not. Therefore, by taking a structure so that wire breakage due to an ESD concentrates on the central linking part 10*a* as illustrated in FIG. 6, it is possible to suppress the effect of an ESD on the detection operation of the capacitive sensor 1.

Also, in the structure, as illustrated in FIG. 7, in which wire breakage due to an ESD concentrates on the central linking part 10*a*, if the peripheral linking part 10*b* beaks for some reason, the time constants of the second transparent electrodes 5 that have been connected to the broken peripheral linking part 10*b* become particularly higher than the time constants of other second transparent electrodes 5. In the example illustrated in FIG. 7, the peripheral linking part 10*b* between the second transparent electrode 5*d*, which is at the fourth position from the second transparent electrode 5*a* disposed at the end on the X1 side toward the X2 side, and the second transparent electrode 5*e*, which is at the second position from the second transparent electrode 5*f* disposed at the end on the X2 side toward the X1 side, is broken. In this case, of the second transparent electrodes 5 that have been connected to the broken peripheral linking part 10*b*, the time constant of the second transparent electrode 5*d* disposed at the fourth position from the second transparent electrode 5*a* toward the X2 side is higher than the time constant of each of the other second transparent electrodes, 5*a*, 5*b*, 5*c*, 5*e* and 5*f*, as illustrated in FIG. 8. That is, the time constant of the second transparent electrode 5*d*, which has been connected to the broken 10*b*, becomes a singular point. Therefore, even if the peripheral linking part 10*b* is broken due to an ESD in, for example, a manufacturing process, the breakage of a peripheral linking part 10*b* can be easily detected in the manufacturing process.

Since the width W1 of the central linking part 10*a* is smaller than the width W2 of the peripheral linking part 10*b*, the electric resistance value of the central linking part 10*a* can be relatively easily made higher than any of the electric resistance values of the peripheral linking parts 10*b* in a process to form the central linking part 10*a* and peripheral linking parts 10*b*. Therefore, it is possible to relatively easily suppress the effect of the breakage of the second linking part 10 due to an ESD on the detection operation of the capacitive sensor 1.

Figure 10:
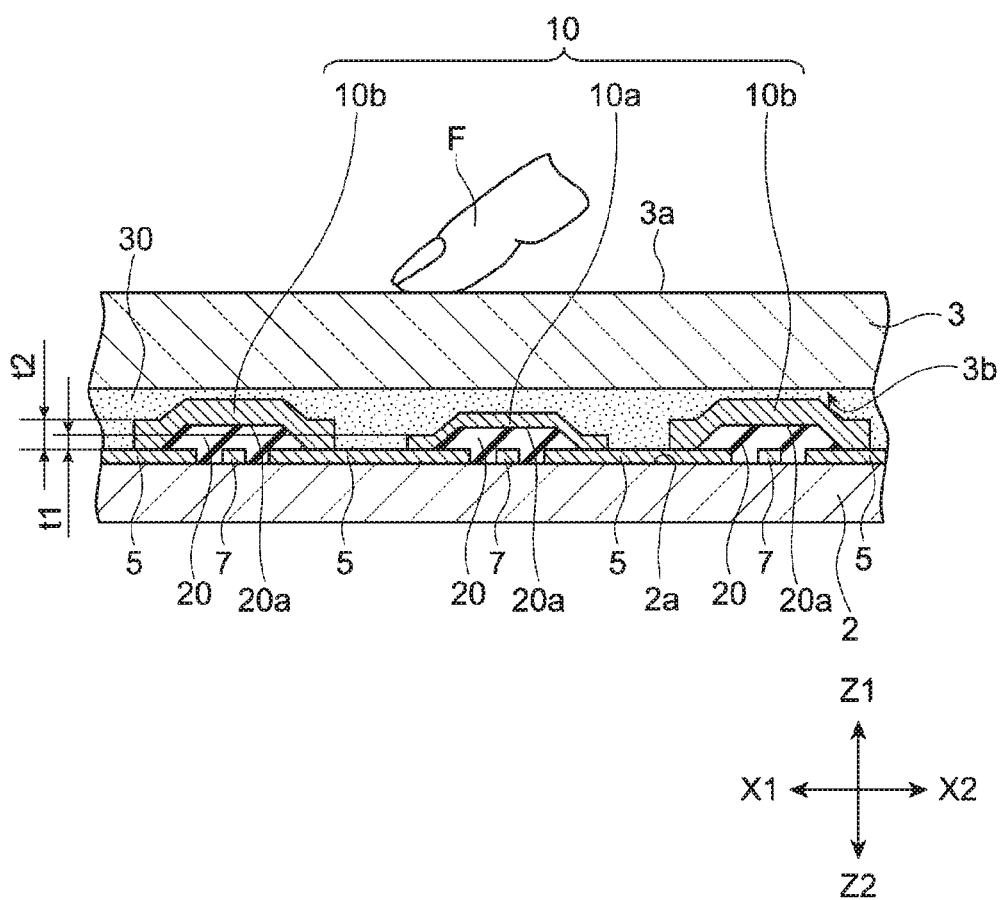
FIG. 10 is a cross-sectional view that explains a second linking part in another embodiment.

FIG. 10 is a cross-sectional view that explains a second linking part in another embodiment. FIG. 10 is equivalent to the cross-sectional view taken along line Iv-Iv indicated in FIG. 3.

In an example in FIG. 10, the thickness t1 of the central linking part 10*a* is preferably smaller the thickness t2 of each peripheral linking part 10*b*. Therefore, the electric resistance value of the central linking part 10*a* becomes higher than the electric resistance value of the peripheral linking part 10*b*. Thus, it is possible to concentrate wire breakage due to an ESD on the central linking part 10*a*, as described above in relation to FIG. 6 to FIG. 9. Therefore, it is possible to suppress the effect of the breakage of the second linking part 10 due to an ESD on the detection operation of the capacitive sensor 1.

Since the thickness t1 of the central linking part 10a is smaller the thickness t2 of the peripheral linking part 10b, the electric resistance value of the central linking part 10a can be relatively easily made higher than the electric resistance value of the peripheral linking part 10b in a process to form the central linking part 10a and peripheral linking parts 10b. Therefore, it is possible to relatively easily suppress the effect of the breakage of the second linking part 10 due to an ESD on the detection operation of the capacitive sensor 1.

In the explanation related to FIGS. 6 to 8 and 10, the electric resistance value of the central linking part 10a is made higher than the electric resistance value of the peripheral linking part 10b by forming the central linking part 10a in a shape different from the shape of the peripheral linking part 10b. By contrast, the electric resistance value of the central linking part 10a may be made higher than the electric resistance value of the peripheral linking part 10b by forming the central linking part 10a with a material different from the material of the peripheral linking part 10b.

That is, the central linking part 10a may include a material that has electric resistivity higher than the electric resistivity of the material of the peripheral linking part 10b. The materials of the central linking part 10a and peripheral linking part 10b include the same materials as the materials of the second linking parts 10 described above with reference to FIG. 1 to FIG. 5. In this case, the electric resistance value of the central linking part 10a can be made higher than the electric resistance value of the peripheral linking part 10b not by the shapes of the central linking part 10a and peripheral linking part 10b but by the materials of the central linking part 10a and peripheral linking part 10b. Therefore, it is possible to more reliably suppress the effect of the breakage of the second linking part 10 due to an ESD on the detection operation of the capacitive sensor 1.

Alternatively, the central linking part 10a and peripheral linking part 10b may be formed in different shapes from each other and with materials different from each other. According to this, the electric resistance value of the central linking part 10a can be made higher than the electric resistance value of the peripheral linking part 10b by both the shapes of the central linking part 10a and peripheral linking part 10b and the materials of the central linking part 10a and peripheral linking part 10b. Therefore, it is possible to still more reliably suppress the effect of the breakage of the second linking part 10 due to an ESD on the detection operation of the capacitive sensor 1.

In the explanation of this embodiment, a case in which damage to wire breakage occurs in the second linking part 10 has been taken as an example. The explanation related to FIG. 6 to FIG. 10 can be similarly applied to the first linking part 7. That is, fourth wiring parts 64 may be further formed in the non-detection area 25, like fourth wiring parts 64 illustrated by dash-dot-dot lines in FIG. 1. In this case, each third wiring part 63 and each fourth wiring part 64 are led out from ends at both sides of the first electrode link 8, one from each end.

Specifically, the third wiring part 63 is led out from one end (end on the Y2 side) of the first electrode link 8 and extends toward one end (end on the Y2 side) of the non-detection area 25. The third wiring part 63 is electrically connected to the one end of the first electrode link 8. The fourth wiring part 64 is led out from another end (end on the Y1 side) of the first electrode link 8 and extends toward another end (end on the Y1 side) of the non-detection area 25. The fourth wiring part 64 is electrically connected to the other end of the first electrode link 8. The third wiring part 63 and fourth wiring part 64 are electrically connected to each other in the non-detection area 25.

The electric resistance value of the central linking part 10a, which electrically connects a plurality of first transparent electrodes 4 placed at the central portion of the detection area 11 in the Y1-Y2 direction in which the first electrode link 8 extends, is higher than the electric resistance value of the peripheral linking part 10b, which electrically connects a plurality of first transparent electrodes 4 placed in other than the central portion (for example, at an end) of the detection area 11 in the Y1-Y2 direction. Thus, it is possible to suppress the effect of the breakage of the first linking part 7 due to an ESD on the detection operation of the capacitive sensor 1.

So far, this embodiment and its application examples have been described. However, the present invention is not limited to these examples. For example, the scope of the present invention also includes embodiments obtained as a result of adding or deleting constituent element to or from the above embodiment or its application examples, performing design changes to the above embodiment or its application examples, or appropriately combining features in embodiments; the addition, deletion, design change, or combination is effected by a person having ordinary skill in the art without departing from the intended scope of the present invention.

What is claimed is:
1. A capacitive sensor comprising:
a base made of a material having a translucent property, a detection area and a non-detection area being defined on the base;
at least one electrode link including a plurality of transparent electrodes, each of which has a translucent property, the plurality of transparent electrodes being arranged in the detection area in a predetermined direction such that the electrode link has a first end and a second end opposite to the first end along the predetermined direction;
a first wiring part disposed and extending in the non-detection area outside the detection area, the first wiring part being electrically connected to the first end of the electrode link;
a second wiring part disposed and extending in the non-detection area, the second wiring part being electrically connected to the second end of the electrode link, the first wiring part and the second wiring part being electrically connected to each other in the non-detection area;
at least one central linking part that electrically connects the transparent electrodes disposed in a central portion in the detection area in the predetermined direction, the at least one central linking part having a first electrical resistance; and
a plurality of peripheral linking parts including:
a plurality of first peripheral linking parts that electrically connect the transparent electrodes disposed in a first side portion provided on a first side in the detection area between the central portion and the first wiring part; and
a plurality of second peripheral linking parts that electrically connect the transparent electrodes disposed in a second side portion provided on a second side in the detection area between the central portion and the second wiring part, the plurality of peripheral linking parts having a second electrical resistance, the first electrical resistance being higher than the second electrical resistance, wherein a number of the at least one central linking part is smaller than a total number of the plurality of first and second peripheral linking parts.

2. The capacitive sensor according to claim 1, wherein a width of the central linking part is smaller than a width of the plurality of peripheral linking parts.

3. The capacitive sensor according to claim 1, wherein a thickness of the central linking part is smaller than a thickness of the plurality of peripheral linking parts.

4. The capacitive sensor according to claim 1, wherein the central linking part includes a material that has an electrical resistivity higher than an electrical resistivity of a material of the plurality of peripheral linking parts.

5. The capacitive sensor according to claim 1, wherein the at least one electrode link includes a plurality of first electrode links each including a plurality of first transparent electrodes arranged in a first direction which is the predetermined direction, the at least one central linking part electrically connecting at least two of the first transparent electrodes disposed in the central portion in the detection area in each first electrode link, and the plurality of peripheral linking parts electrically connecting one of remaining first transparent electrodes to adjacent one of the first transparent electrodes in the first direction in each first electrode link.

6. The capacitive sensor according to claim 5, further comprising:
a plurality of second electrode links each including a plurality of second transparent electrodes arranged in a second direction crossing the first direction, the plurality of second transparent electrodes being electrically connected by second linking parts which are integrally formed with the second transparent electrodes.

7. The capacitive sensor according to claim 6, wherein the at least one central linking part and the plurality of peripheral linking parts bridge over corresponding second linking parts of the second electrode links with an insulating layer interposed therebetween.

8. The capacitive sensor according to claim 1, wherein the at least one central linking part is configured to break more easily than the plurality of peripheral linking parts if an electrostatic discharge occurs in the electrode link.

9. The capacitive sensor according to claim 1, wherein a number of the first peripheral linking parts disposed in the first side portion and a number of the second peripheral linking parts disposed in the second side portion are the same.

10. The capacitive sensor according to claim 1, wherein the first electrical resistance of the at least one central linking part higher than the second electrical resistance allows the at least one central linking part to be more likely to break than the plurality of peripheral linking parts are, in case of an electrostatic discharge in the electrode link.

11. The capacitive sensor according to claim 1, wherein each of the plurality of transparent electrodes is configured to store charges by forming a capacitance with an object approaching thereto, the charge being supplied from the first and second wiring parts through the first and second ends of the electrode link, respectively, and wherein the first electrical resistance of the at least one central linking part higher than the second electrical resistance allows the transparent electrodes disposed in the first side portion receive a substantial part of the charges from the first end, while the transparent electrodes disposed in the second side portion receive a substantial part of the charges from the second end.

* * * * *